United States Patent [19]

Lewis et al.

[11] Patent Number: 4,636,773
[45] Date of Patent: Jan. 13, 1987

[54] BINARILY WEIGHTED PULSE WIDTH DIGITAL-TO-ANALOG CONVERTER

[75] Inventors: Dan E. Lewis, Mission Viejo; James L. Gundersen, Laguna Beach, both of Calif.

[73] Assignee: Hughes Aircraft Company, Los Angeles, Calif.

[21] Appl. No.: 801,539

[22] Filed: Nov. 25, 1985

[51] Int. Cl.$^4$ ............................................. H03K 13/02
[52] U.S. Cl. ...................... 340/347 DA; 340/347 CC; 340/347 M; 377/42; 377/52; 364/757
[58] Field of Search .................... 340/347 DA, 347 M; 377/42, 52; 364/757

[56] References Cited

U.S. PATENT DOCUMENTS 3,823,396  7/1974  Lode .......................... 340/347 DA
4,016,558  4/1977  Bishop et al. ............... 340/347 DA

OTHER PUBLICATIONS

The Engineering Staff of Analog Devices, Inc., Analog-Digital Conversion Handbook, 6/1972, pp. II-16 to II-27.

Primary Examiner—T. J. Sloyan
Attorney, Agent, or Firm—Joseph E. Szabo; Anthony W. Karambelas

[57] ABSTRACT

A digital-to-analog converter system for converting a digital input signal having parallel words, each word including multi-bit groups of weighted significance, and which is provided at an input word rate of W Hz, is disclosed. The digital-to-analog converter system (10, 100, 200) includes pulse generating circuitry (11, 13, 111, 113, 211, 213) responsive to a first multi-bit group and a second multi-bit group of the digital input words for providing (a) a first pulse modulated signal as a function of the value of the first multi-bit group and (b) a second pulse modulated signal as a function of the value of the second multi-bit group; weighting elements (15, 19, 115, 119, 215, 219) for weighting the first and second pulse modulated signals as a function of the relative weighted significance of the first and second multi-bit groups; and output circuitry (20, 120, 220) for summing and filtering the weighted signals to provide an analog output signal that is representative of the digital input signal.

13 Claims, 11 Drawing Figures

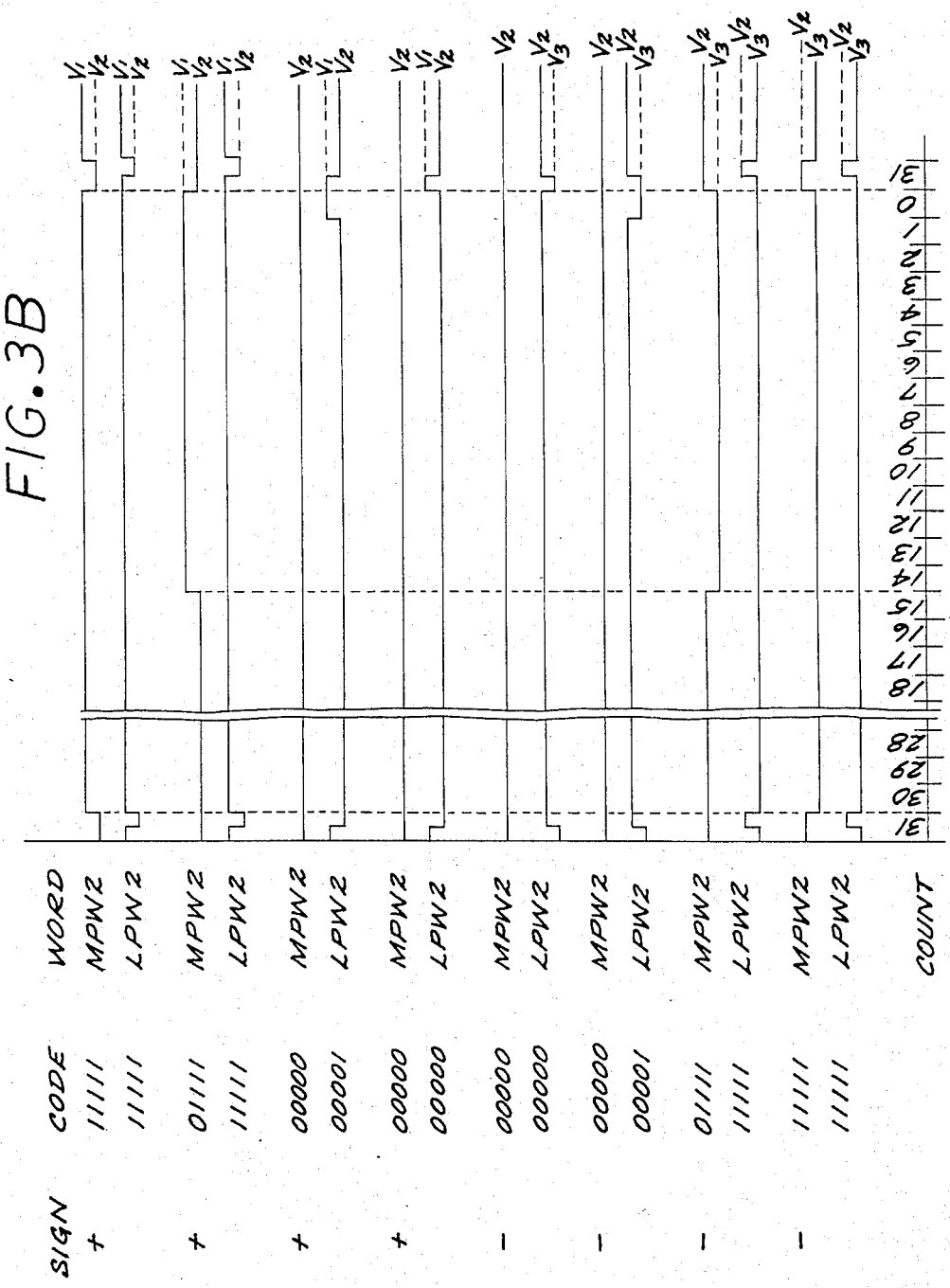

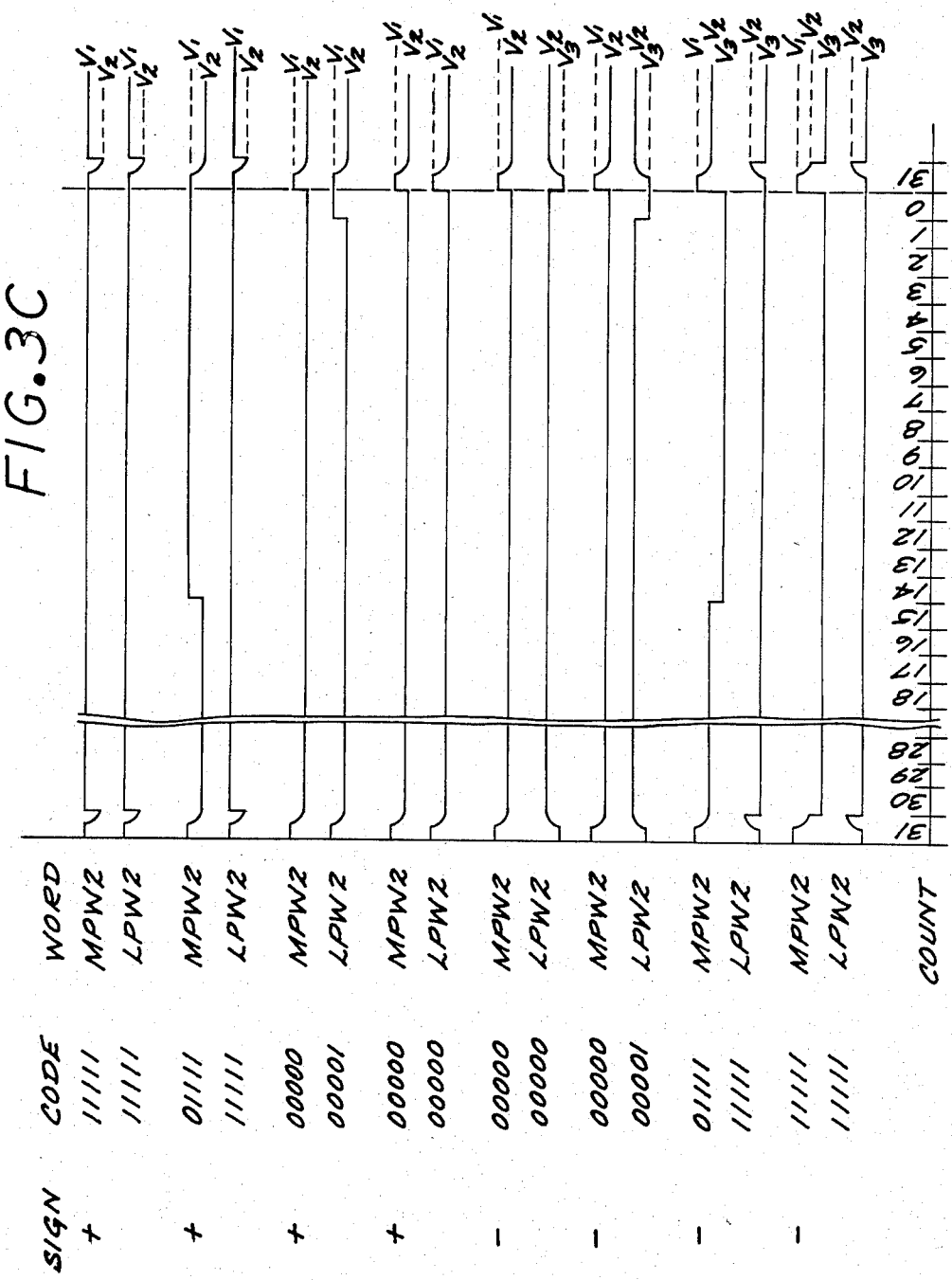

BINARILY WEIGHTED PULSE WIDTH DIGITAL-TO-ANALOG CONVERTER

BACKGROUND OF THE INVENTION

The disclosed invention generally relates to digital-to-analog converters and is particularly directed to a segmented pulse width modulated (PWM) digital-to-analog (D/A) converter having parallel conversion stages.

D/A converters are utilized to provide an analog signal, such as a voltage, as function of a digital input. For example, certain information may be digitally processed and then converted for use with analog processing circuitry. Particular examples of such applications of D/A converters include compact laser disc players, multiplexed aircraft audio systems, and instrumentation applications Pulse width modulated (PWM) D/A converters typically include a pulse width modulator which provides a pulse width modulated signal having pulses with respective widths (and areas) that are proportional to the input digital signal. The output of the pulse width modulator is provided to an integrator which generally functions as a low pass filter. The integrator output is an analog signal which has a characteristic (e.g., voltage) that is proportional to the pulse width modulated signal, and is therefore proportional to the digital input signal.

Typically, the modulated pulses are provided by the output of a flip-flop that is controlled by a resettable counter and a comparator. At the beginning of each pulse period the counter starts counting and the flip-flop is set to provide a high output for a non-zero N-bit digital input. The flip-flop output remains high until the counter output corresponds to the digital input, at which time the flip-flop is reset. The counter has a maximum count equal to the maximum value $2^N$ of the digital input, and such maximum count must be reached within the pulse period. Thus, the counter clock must be at least as fast as the pulse rate multiplied by the maximum digital input value $2^N$.

Generally, the output pulses are provided at a fixed pulse rate (which is also the conversion rate) so that the start of each pulse (including a pulse of zero width and area) is periodic. Such pulse rate may be equal to the rate at which digital values are provided to the pulse width modulator (the digital input rate), whereby each digital input is converted once. However, it is well known for pulse width modulation systems that a pulse rate that is close to the spectral content of the analog signal of interest creates distortion in such analog signal. Additionally, the time constant of the integrator cannot be too small in comparison to the pulse period since too small a time constant would result in excessive ripple. However, a longer time constant reduces the high frequency response of the D/A converter.

A known technique for avoiding the foregoing problems is the use of a pulse rate that is higher than the digital input rate, whereby each digital input is converted more than once (i.e., used to modulate more than one pulse). The integrator time constant is accordingly reduced. However, an increased pulse rate also requires an increased counter clock rate for the pulse width modulator.

For example, for a 10 bit digital input provided at a 30 KHz rate and converted with a 30 KHz pulse rate (i.e., each input value is used to modulate only one pulse), a counter clock rate of 30.72 MHz is required. Increasing the pulse rate by a factor of 5 to 150 KHz to avoid distortion would require a counter clock rate of 153.6 MHz. It should therefore be readily apparent that PWM D/A conversion with known techniques has limitations as to digital input frequencies. Additionally, with known PWM D/A conversion the required clock rates increase dramatically with increased digital input rates.

U.S. Pat. No. 4,233,591, issued to Murata et al. on Nov. 11, 1980, apparently provides for an effectively increased pulse rate by dividing the pulse for each input into several pulses that are distributed over a single pulse period. However, the system of the '591 patent still requires a counter clock rate equal to the digital input rate times $2^N$ for an N-bit input.

SUMMARY OF THE INVENTION

It would therefore be an advantage to provide a pulse width modulated (PWM) digital-to-analog (D/A) converter which does not require a very high clock rate for a given pulse rate.

Another advantage would be to provide a PWM D/A converter which provides for high resolution without requiring very high clock rates.

Still another advantage would be to provide a PWM D/A converter which provides for a high digital input rate without requiring very high clock rates.

A further advantage would be to provide a PWM D/A converter which achieves conversion of an N-bit input with a counter clock rate that is at most equal to the pulse rate times $2^{(N/2)}$.

It would also be an advantage to provide a PWM D/A converter which includes primarily digital circuitry and reduced analog circuitry.

Another advantage would be to provide a PWM D/A converter which utilizes few precision elements.

Still another would be to provide a PWM D/A converter which is readily implemented using LSI technologies.

Yet another advantage would be to provide a sign/magnitude PWM D/A converter which provides for high resolution without requiring very high clock rates.

The foregoing and other advantages and features are provided in a digital-to-analog converter for converting a digital input signal having parallel N-bit words, each word including multi-bit groups of weighted significance, and which is provided at an input word rate of W Hz. The digital-to-analog converter system includes pulse generating circuitry responsive to a first multi-bit group and a second multi-bit group of the N-bit digital input for providing (a) a first pulse modulated signal as a function of the value of the first multi-bit group and (b) a second pulse modulated signal as a function of the value of the second multi-bit group; weighting elements for weighting the first and second pulse modulated signals as a function of the relative weighted significance of the first and second multi-bit groups; and output circuitry for summing and filtering the weighted signals to provide an analog output signal that is representative of the digital input signal.

A further aspect of the invention is directed to a sign/magnitude digital-to-analog converter for converting a digital input signal having parallel words which respectively include a sign bit and N magnitude bits having multi-bit groups of weighted significance, and which are provided at an input rate of W Hz. The sign/magnitude digital-to-analog converter includes pulse generating circuitry responsive to a first multi-bit group and a second multi-bit group of the N-bit digital input for providing (a) a first pulse modulated signal having pulse widths and levels as a function of the sign bit and the value of the first multi-bit group and (b) a second pulse modulated signal as a function of the sign bit and the value of the second multi-bit group; weighting elements for weighting the first and second pulse modulated signals as a function of the relative weighted significance of the first and second multi-bit groups; and output circuitry for summing and filtering the weighted signals to provide an analog output signal that is representative of the digital input signal.

A further aspect of the sign/magnitude digital-to-analog converter is directed to providing different analog outputs for digital inputs having different signals and a zero magnitude.

Still another aspect of the sign/magnitude digital-to-analog converter is directed to compensating errors due to different pulse edge transition times.

BRIEF DESCRIPTION OF THE DRAWING

The advantages and features of the disclosed invention will readily be appreciated by persons skilled in the art from the following detailed description when read in conjunction with the drawing wherein:

FIGS. 3A through 3C are timing diagrams which are useful in understanding the disclosed embodiments of the invention.

DETAILED DESCRIPTION OF THE DISCLOSURE

Figure 1:
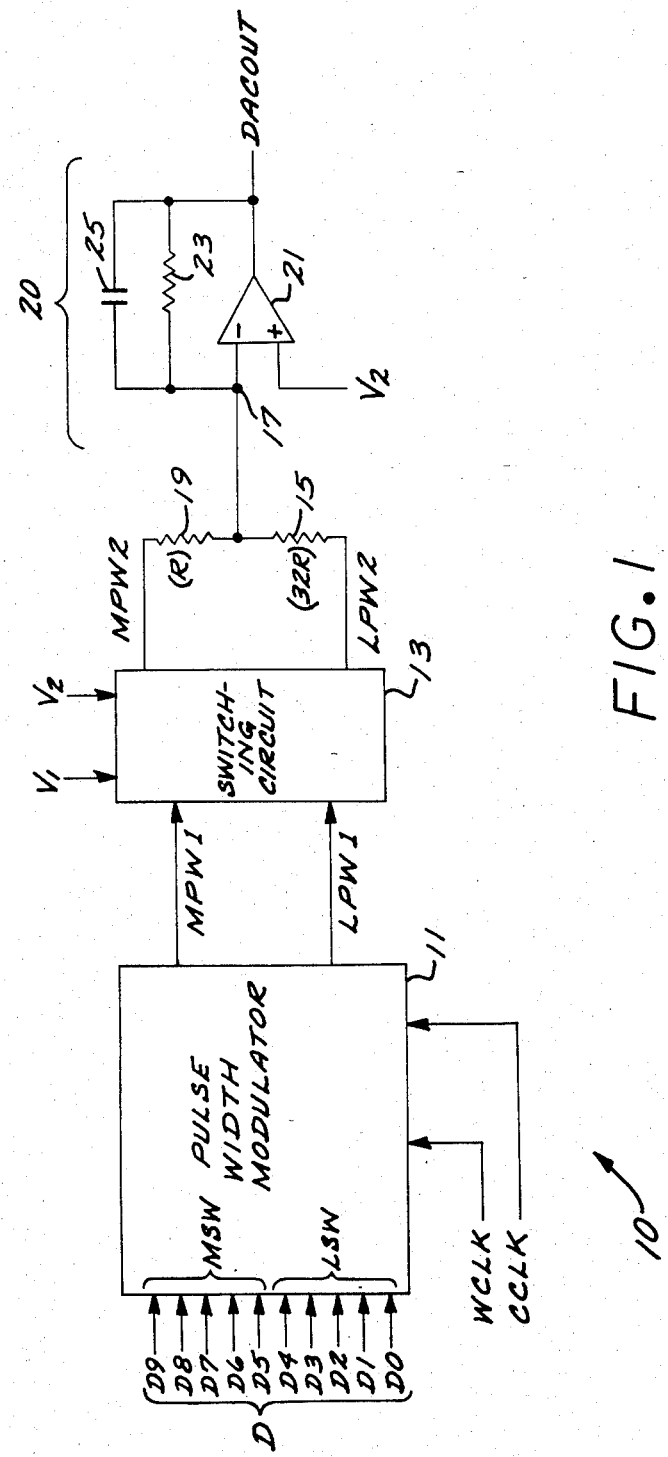
FIG. 1 is a schematic partial block diagram of a digital-to-analog converter in accordance with the invention.

In the following detailed description and in the several figures of the drawing, like elements are identified with like reference numerals.

Referring now to FIG. 1, shown therein is a D/A converter 10 which accepts a 10-bit input D having bits D0 through D9, where D0 is the least significant bit and D9 is the most significant bit. It should be readily understood that the input D is a sequence of 10-bit words that are provided at a word rate. Thus, for example, the word rate may be 30 KHz, in which case new 10-bit words are provided 30,000 times per second. For reference, a bit value of 0 may be represented by a logical low, and a bit value of 1 may be represented by a logical high.

The input bits D0 through D9 are grouped into two groups having five bits each. The group having the bits D0 through D4 shall be called the least significant word (LSW), and the group having the bits D5 through D9 shall be called the most significant word (MSW).

The LSW (D0 through D4) and MSW (D5 through D9) are provided to a pulse width modulator 11 which provides pulse width modulated outputs LPW1 and MPW1. The output LPW1 includes pulse widths proportional to the digital values of the LSW; and the output MPW1 includes pulse widths proportional to the digital values of the MSW. As discussed more fully relative to the pulse width modulator of FIG. 4, the pulse width modulated outputs LPW1 and MPW1 have logical levels.

Figure 2:
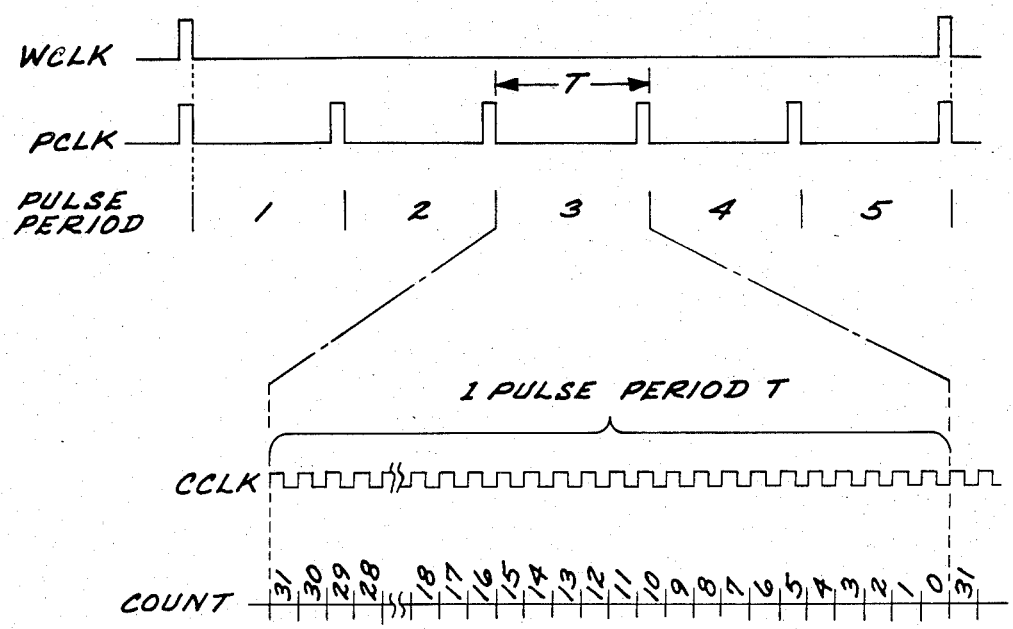
FIG. 2 is a timing diagram that is useful in understanding the analog-to-digital converter of FIG. 1.

Referring also to FIG. 2, the pulse width modulator 11 of the D/A converter 10 of FIG. 1 receives a word clock signal WCLK which is utilized to read the LSW and the MSW of the digital input D. Generally, the word clock signal WCLK has the same frequency as the word rate (i.e., the rate at which the 10 bit words are provided) and is phased to enable reading an input word when it is valid data. The pulse width modulator 11 provides a pulse clock signal PCLK which defines the rate at which modulated pulses are provided. That is, the pulse clock signal PCLK defines a periodic interval T during which a modulated pulse may be provided. The pulse clock signal PCLK has a frequency that is integrally related to the frequency of the word clock signal WCLK. Preferably, the frequency of the pulse clock signal PCLK is 3–10 times the frequency of the word clock signal WCLK. The generation of the pulse clock signal PCLK is more fully discussed relative to the schematic diagram of the pulse width modulator shown in FIG. 4.

A count clock signal CCLK is also provided to the pulse width modulator 11 and is utilized to clock a counter, as will be discussed further herein. The frequency of the count clock signal CCLK is $2^M$ times the frequency of the pulse clock signal PCLK, where M is the number of bits in each of the LSW and MSW (in this example M is equal to 5). That provides for $2^M$ cycles of the count clock signal CCLK for each period T of the pulse clock signal PCLK.

FIG. 2 specifically shows by way of example the relationship between the word clock signal WCLK, the pulse clock signal PCLK, and the count clock signal CCLK. Particularly, the frequency of the pulse clock signal PCLK is shown as being 5 times the frequency of the word clock signal WCLK. As further shown, the negative going edge of the pulse clock signal PCLK defines the end of a pulse period and the beginning of the next pulse period. Also shown in FIG. 2 is a timing diagram of the count clock signal CCLK for a pulse period as defined by the pulse clock signal PCLK. Particularly, the count clock signal CCLK provides 32 clock cycles for each pulse period T, as required for the 5-bit LSW and the 5-bit MSW.

The pulse width modulated outputs LPW1 and MPW1 from the pulse width modulator 11 are provided to a switching circuit 13 which also receives the reference voltages V1 and V2 as inputs. The reference voltages are related as follows:

$$V2 < V1 \qquad \text{(Equation 1)}$$

In response to the pulse width modulated signal LPW1, the switching circuit 13 provides a level shifted pulse width modulated signal LPW2 which has a voltage level of V1 or V2 depending on the pulse width modulated signal LPW1. Particularly, the level shifted signal LPW2 is at V1 during the presence of a pulse (LPW1 is high), and is at V2 in the absence of a pulse (LPW1 is low).

In response to the pulse width modulated signal MPW1, the switching circuit 13 provides a level shifted pulse width modulated signal MPW2 which has a voltage level of V1 or V2 depending on the pulse width modulated signal MPW1. Particularly, the level shifted signal MPW2 is at V1 during the presence of a pulse (MPW1 is high), and is at V2 in the absence of a pulse (MPW1 is low).

Figure 3A:
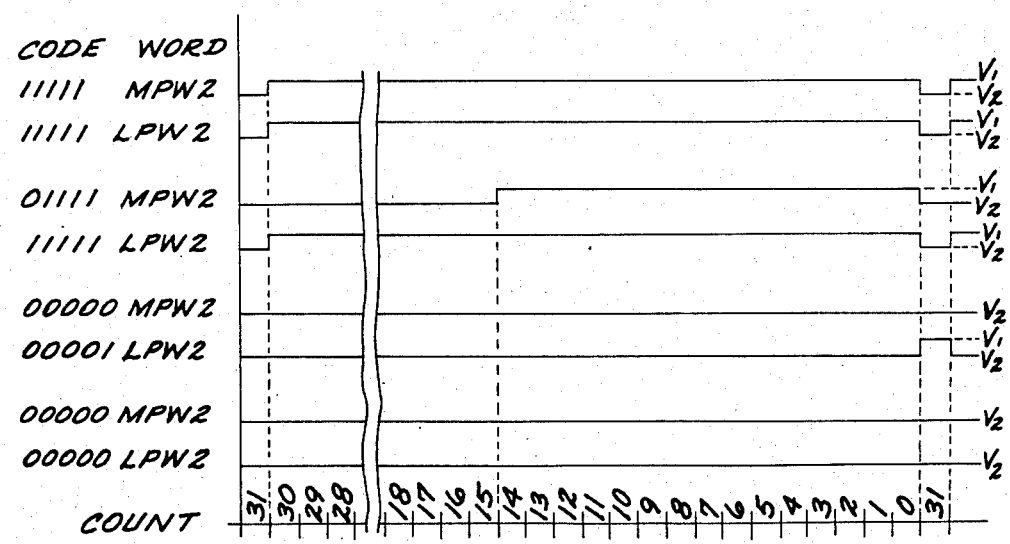

Referring briefly to FIG. 3A, illustrated therein are waveforms of the level shifted pulse width modulated signals LPW2 and MPW2 for certain codes of the LSW and MSW.

The level shifted signal LPW2 of the switching circuit 13 is coupled through a weighted resistor 15 to a summing node 17. The level shifted signal MPW2 of the switching circuit 13 is coupled through a weighted resistor 19 to the summing node 17. For the 5-bit LSW and MSW discussed in this example, the value of the resistor 15 is 32 times the value of the resistor 19. Thus, the resistor 15 is shown as having a value of 32R, while the resistor 19 is shown as having a value of R.

The foregoing ratio between the resistors 15, 19 follows from the fact that the weight of the MSW is $2^5$ times the weight of the LSW.

The summing node 17 is coupled to the inverting input of an operational amplifier 21 which provides an analog output signal DACOUT that is the analog version of the digital input D. A feedback resistor 23 and a feedback capacitor 25 are coupled in parallel between the output of the operational amplifier 21 and its inverting input. The operational amplifier 21, the feedback resistor 23 and the feedback capacitor 25 cooperate to sum the currents through the weighted resistors 15, 19 at the summing node 17. The non-inverting input of the operational amplifier 21 is coupled to the reference voltage V2. The operational amplifier 21 and the associated feedback circuitry function as an integrator 20, which may also be considered a low pass filter.

Figure 4:
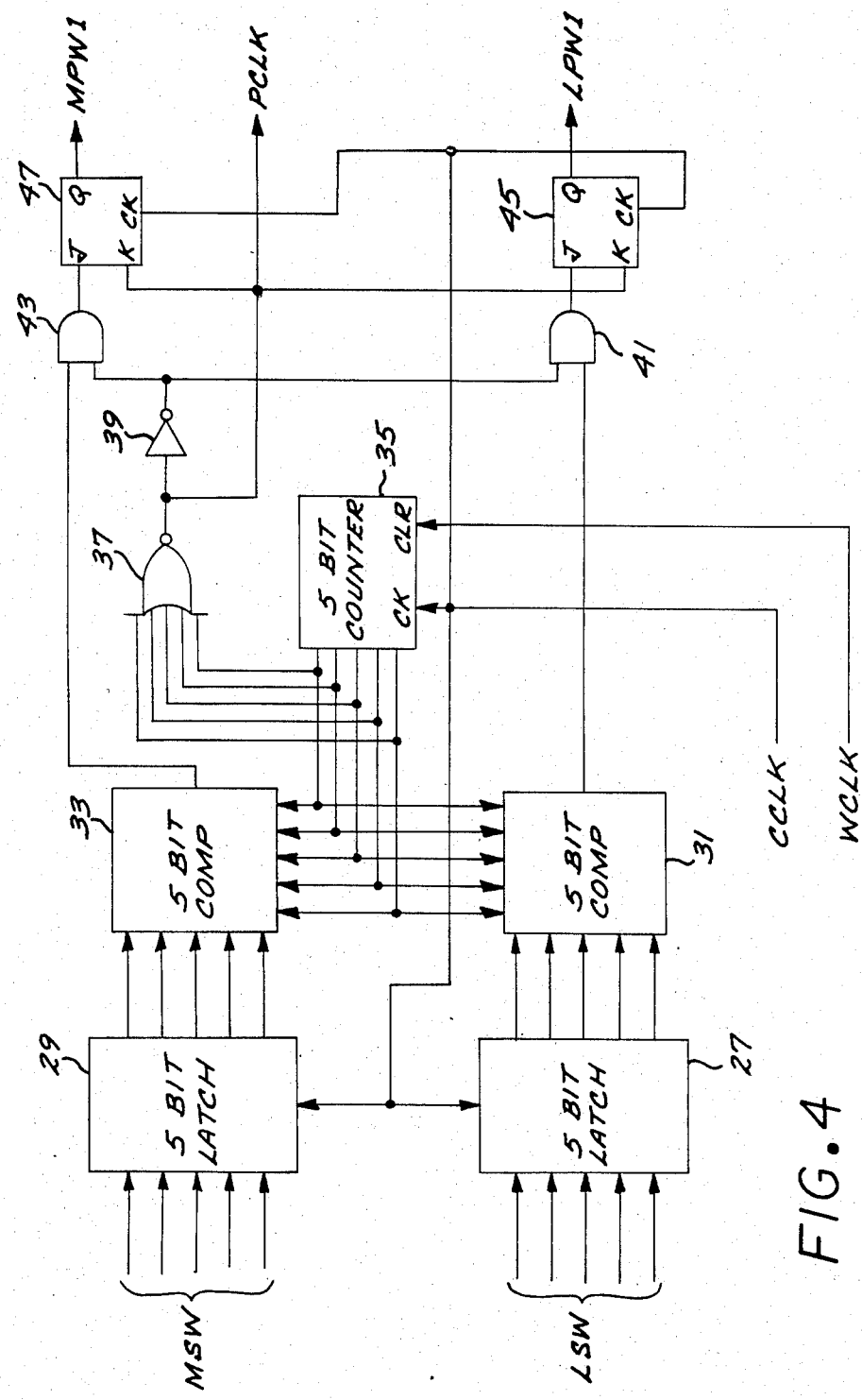
FIG. 4 is a schematic diagram of the pulse width modulator of the digital-to-analog converter of FIG. 1.

Referring now to FIG. 4, shown therein is a schematic diagram of the pulse width modulator 11 which includes a 5-bit latch 27 for latching the LSW of the digital input D and a 5-bit latch 29 for latching the MSW of the input D. The latches 27, 29 are clocked with the word clock signal WCLK.

The latched outputs of the latch 27 are provided as inputs to a 5-bit comparator 31, while the latched outputs of the latch 29 are provided as inputs to another 5-bit comparator 33. Inputs to each of the comparators 31, 33 are also provided by the count output of a 5-bit down counter 35. The count clock signal CCLK is provided to the clock input CK of the down counter 35, which further receives the word clock signal WCLK at its clear input CLR. The comparator 31 provides a high output signal upon coincidence of the inputs provided by the latch 27 and the down counter 35. The comparator 33 provides a high output upon coincidence of the inputs provided by the latch 29 and the down counter 35.

It should be noted that the down counter 35 has the same number of bits as each of the least significant word LSW and the most significant word MSW. That allows the down counter 35 to provide count outputs that respectively correspond to each of the possible values of the LSW and the MSW.

The count output of the down counter 35 is further provided as inputs to a 5-input NOR gate 37 which provides the pulse clock signal PCLK as its output. The pulse clock signal PCLK is high pursuant to an all 0's output of the 5-bit down counter 35. As shown in FIGS. 2 and 3A, the negative going edge of the pulse clock signal PCLK defines the end of a given pulse period T and the beginning of the next. It should be noted that the pulse clock signal PCLK is used only within the pulse width modulator 11 for the D/A converter 10 of FIG. 1. However, the pulse clock signal PCLK will be utilized outside the pulse width modulator 11 for other disclosed embodiments of the invention. The pulse clock signal PCLK provides one pulse for every 32 cycles of the count clock signal CCLK.

The pulse clock signal PCLK from the NOR gate 37 is provided to an inverter 39 which in turn provides an input to a 2-input AND gate 41. The other input to the AND gate 41 is provided by the output of the comparator 31. The output of the inverter 39 is also provided as an input to another 2-input AND gate 43. The other input to the AND gate 43 is provided by the output of the comparator 33.

The output of the AND gate 41 is coupled to the J input of a JK flip-flop 45. The K input of the JK flip-flop 45 receives the pulse clock signal PCLK provided by the NOR gate 37. The JK flip-flop 45 is clocked with the count clock signal CCLK and provides the pulse width modulated signal LSW1 at its Q output.

The output of the AND gate 43 is coupled to the J input of a JK flip-flop 47. The K input of the JK flip-flop 47 receives the pulse clock signal PCLK provided by the NOR gate 37. The JK flip-flop 47 is clocked with the count clock signal CCLK and provides the pulse width modulated signal MSW1 at its Q output.

In operation, the word clock signal WCLK latches the LSW and MSW of a new input D into the respective latches 27, 29 prior to the beginning of a pulse period, and further clears the down counter 35 to provide an all 0's output. On the next occurrence of the count clock signal CCLK, the down counter 35 provides an output having a decimal value of 31, and on the subsequent occurrence of the count clock signal CCLK provides an output having a decimal value of 30, and so forth. So long as the output of the down counter 35 is not all 0's, the output of the inverter 39 is high.

While the output of the down counter 35 is not all 0's, a coincidence indicating high output from the comparator 31 will cause the output of the AND gate 41 to go high. The pulse width modulated signal LPW1, as provided by the Q output of the JK flip-flop 45, will go high on the next occurrence of the count clock signal CCLK after the occurrence that caused the output of the comparator 31 to go high.

Similarly, while the output of the down counter 35 is not all 0's, a coincidence indicating high output from the comparator 33 will cause the output of the AND gate 43 to go high. The pulse width modulated signal MPW1, as provided by the Q output of the JK flip-flop 47 will go high on the next occurrence of the count clock signal CCLK after the occurrence that caused the output of the comparator 33 to go high.

On the last occurrence of the count clock signal CCLK for a pulse period, the down counter 35 provides an output of all 0's, and the pulse clock signal PCLK goes high. Therefore, on the next occurrence of the count clock signal CCLK, which corresponds to the beginning of a pulse period, the Q outputs of the JK flip-flops 45, 47 become low and the modulated pulses terminate.

Thus, the pulse width modulator 11 provides pulse width modulated signals LPW1 and MPW1 which have widths respectively determined by the digital values of the least significant word LSW and the most significant word MSW. The pulses of each of the modulated signals LPW1 and MPW1 begin at different times as a function of the digital values of the LSW and the MSW, but they end at the end of the pulse period. The pulse width modulated outputs LPW1 and MPW1 have waveforms similar to the waveforms in FIG. 3A of the level shifted pulse width modulated signals LPW2 and MPW2.

Specifically, the widths of the pulses provided by the pulse width modulator 11 are quantized so that a given pulse may have a width from 0 to 31 quantums, a quantum being one cycle or period of the count clock signal CCLK.

Figure 5:
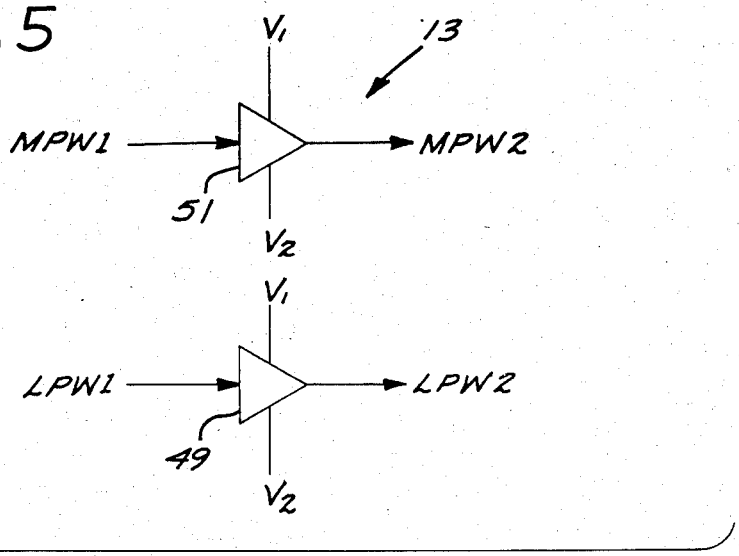
FIG. 5 is a schematic diagram of the switch circuit of the digital-to-analog converter of FIG. 1.

Referring now to FIG. 5, schematically shown therein is the switching circuit 13 of the D/A converter 10 of FIG. 1. The switching circuit 13 includes an analog buffer 49 which accepts the reference voltages V1, V2 and the pulse width modulated signal LPW1 as inputs. The output of the buffer 49 is the level shifted pulse width modulated signal LPW2 discussed above relative to FIG. 1. The switching circuit 13 further includes another analog buffer 51 which accepts the reference voltages V1, V2 and the pulse width modulated signal MPW1 as inputs. The output of the buffer 51 is the level shifted pulse width modulated signal MPW2 discussed above relative to FIG. 1.

Referring to FIG. 3A, illustrated therein are waveforms of the level shifted pulse width modulated signals LPW2 and MPW2 for certain codes of the LSW and MSW. For ease of reference, FIG. 3A includes a timing diagram of the count output of the down counter 35 for 1 pulse period T. As particularly shown, the modulated pulses start at different times as a function of the associated LSW or MSW codes, and they end at the same time, namely the end of a pulse period T.

Referring also to FIG. 1, it should be readily apparent that the switching circuit 13 may be removed if the outputs of the pulse width modulator 11 provide appropriate voltage levels. Thus, if the logical levels provided by the Q outputs of the JK flip-flops 45, 47 in the pulse width modulator 11 of FIG. 3 are appropriate, then such Q outputs would be directly connected to the weighted resistors 15, 19. In that case, the non-inverting output of the operational amplifier 21 would then be coupled to logical low.

Figure 6:
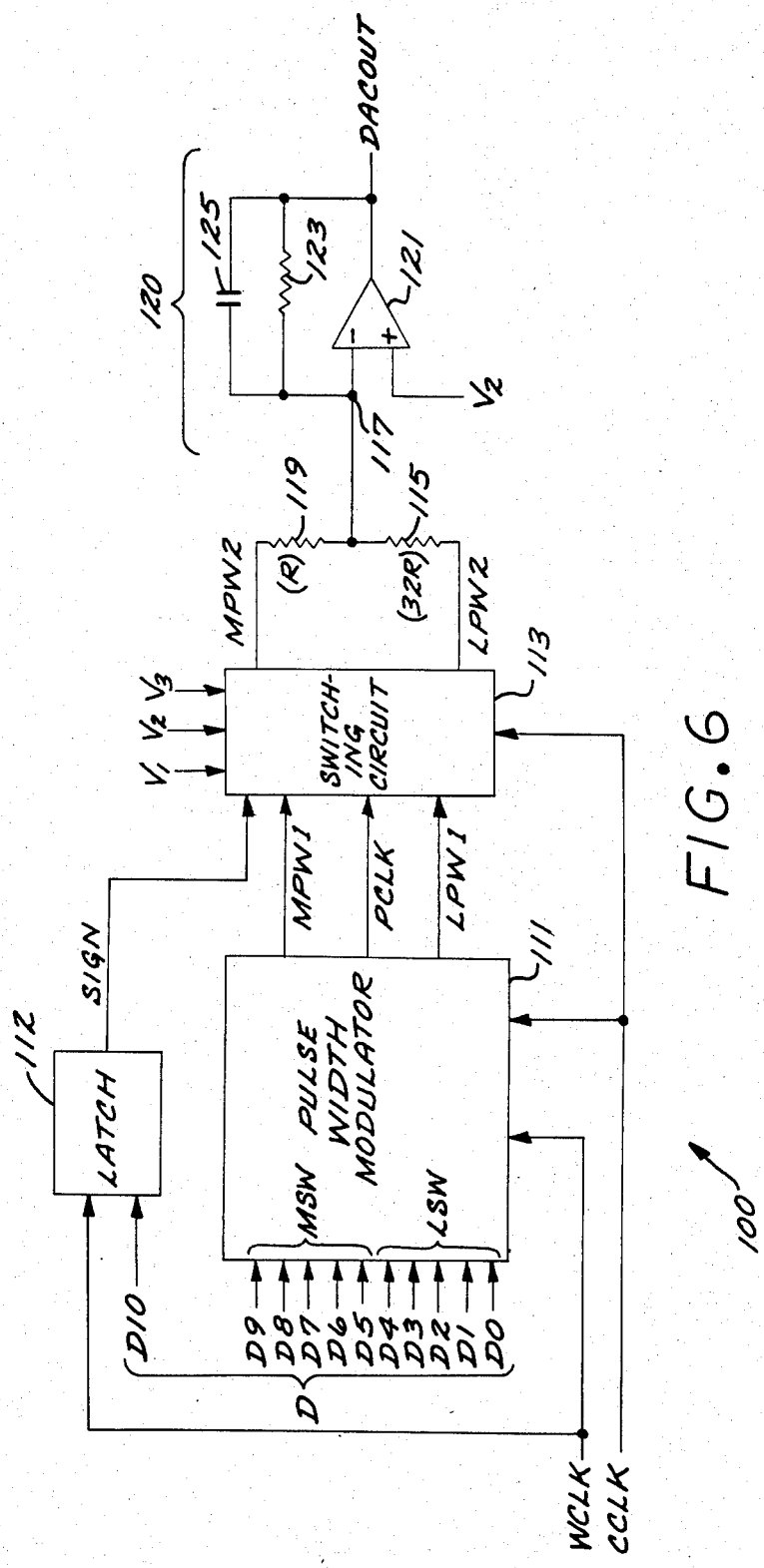
FIG. 6 is a schematic partial block diagram of a sign-/magnitude digital-to-analog converter in accordance with the invention.

Referring now to FIG. 6, shown therein is a partial block diagram of a sign and magnitude D/A converter 100 of the invention which accepts an 11-bit input D, where D0 through D9 are the magnitude bits and D10 is the sign bit. The input bit D0 is the least significant bit and the input bit D9 is the most significant bit. As with the D/A converter 10 of FIG. 1, the magnitude bits D0 through D9 are grouped into two groups of five bits each, where the group having the bits D0 through D4 is the least significant word (LSW) and the group having the bits D5 through D9 is the most significant word (MSW). For reference, the sign bit is 1 to indicate a positive sign and is 0 to indicate a negative sign. Also for reference, a 0 sign bit (negative) may be represented by a logical low signal, and a 1 sign bit (positive) may be represented by a logical high signal.

It should be readily understood that the input D to the sign/magnitude D/A converter 100 has two distinct values or codes with a magnitude of all 0's since such magnitude of all 0's may have a positive sign or a negative sign. In the sign/magnitude D/A converter 100, the availability of two distinct codes having a magnitude of zero is advantageously utilized to provide corresponding distinct analog outputs, which maintains the analog output steps that correspond to different values of the digital input D of uniform size as the digital input D goes through zero. As a result, the analog output is monotonic throughout the entire range of the digital input D, including the portion through zero.

As discussed more fully herein, the two distinct analog outputs for the all 0's magnitude are achieved by including for each of the LSW codes a level shifted pulse width modulated signal having an initial pulse of a half quantum width and appropriate voltage level controlled by the sign bit. When the LSW is all 0's, the level shifted pulse width modulated signal includes only such initial pulse. The non-zero codes for the LSW include the initial pulse and another pulse having a width equal to the number of quantums corresponding to the digital value of the LSW.

The least significant word LSW and the most significant word MSW are provided to a pulse width modulator 111 which may be substantially similar to the pulse width modulator 11 schematically shown in FIG. 3. The pulse width modulator 111 provides pulse width modulated outputs LPW1 and MPW1 which have logical levels. The output LPW1 includes pulse widths proportional to the digital values of the LSW; and the output MPW1 includes pulse widths proportional to the digital values of the MSW.

The sign bit D10 is latched into a 1-bit latch 112 which is clocked with the word clock signal WCLK. The output of the latch 112 provides a sign control signal SIGN. The sign control signal is low for a positive sign and is high for a negative sign.

The sign control signal SIGN from the latch 112 and the pulse width modulated outputs LPW1 and MPW1 from the pulse width modulator 111 are provided as inputs to a switching circuit 113. The switching circuit 113 also receives the reference voltages V1, V2, and V3 as inputs. The reference voltages are related as follows:

$$V3 < V2 < V1 \qquad \text{(Equation 2)}$$

$$V2 = (V3 + V1)/2 \qquad \text{(Equation 3)}$$

In response to the pulse width modulated output LPW1, the switching circuit 113 provides a level shifted pulse width modulated output signal LPW2. For each pulse period, the signal LPW2 includes a half quantum wide pulse at the beginning of a pulse period and a subsequent width modulated pulse having a width controlled by the pulse width modulated signal LPW1. For a given pulse period T, the value or level of the initial and width modulated pulses is at the reference voltage V3 if the sign control signal SIGN is low, and is at the reference voltage V1 if the sign control signal SIGN is high. When the level shifted pulse width modulated signal LPW2 is not providing such pulses, it is at the reference voltage V2.

The foregoing conditions for the width modulated pulse of the signal LPW2 are summarized in the following Table I:

TABLE I

| SIGN | LPW1 | LPW2 |
|---|---|---|
| LOW | HIGH | V3 |
| LOW | LOW | V2 |
| HIGH | HIGH | V1 |
| HIGH | LOW | V2 |

In response to the pulse width modulated output signal MPW1 from the pulse width modulator 111, the switching circuit 113 provides a level shifted pulse width modulated signal MPW2 which has a voltage level of V1, V2 or V3 depending on the pulse width modulated signal MPW1 and the sign control signal SIGN. Particularly, if the sign control signal SIGN is low, the output MPW2 is at V3 when the signal MPW1 is high, and is at V2 when the signal MPW1 is low. If the signal control signal SIGN is high, the output MPW2 is at V1 when the signal MPW1 is high, and is at V2 when the signal MPW1 is low.

The following Table II sets forth the conditions for determining the level shifted pulse width modulated output MPW2 provided by the switching circuit 113:

TABLE II

| SIGN | MPW1 | MPW2 |
|---|---|---|
| LOW | HIGH | V3 |
| LOW | LOW | V2 |
| HIGH | HIGH | V1 |
| HIGH | LOW | V2 |

The output LPW2 of the switching circuit 113 is coupled through a weighted resistor 115 to a summing node 117. The output MPW2 of the switching circuit 113 is coupled through a weighted resistor 119 to the summing node 117. For the 5-bit LSW and MSW discussed in this example, the value of the resistor 115 is 32 times the value of the resistor 119. Thus, the resistor 115 is shown as having a value of 32R, while the resistor 119 is shown as having a value of R.

The foregoing ratio between the resistors 115, 119 follows from the fact that the weight of the MSW is $2^5$ in times the weight of the LSW.

The summing node 117 is coupled to an integrator 120, which may also be considered a low pass filter and which is similar to the integrator 20 shown in FIG. 1. The integrator 120 includes an operational amplifier 121 which has its non-inverting input coupled to the summing node 117 and which provides an analog output signal DACOUT which is the analog version of the digital input D. A feedback resistor 123 and a feedback capacitor 125 are coupled in parallel between the output of the operational amplifier 121 and its inverting input. The operational amplifier 121, the feedback resistor 123 and the feedback capacitor 125 cooperate to sum the currents through the weighted resistors 115, 119 at the summing node 117. The non-inverting input of the operational amplifier 121 is coupled to the reference voltage V2.

Figure 7:
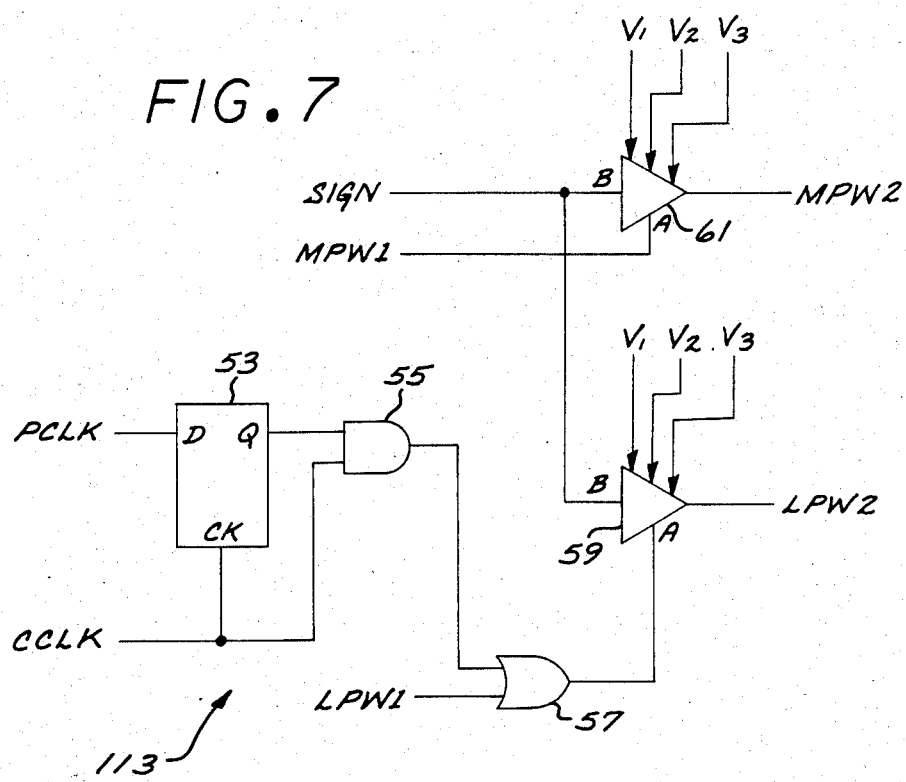
FIG. 7 is a schematic diagram of the switch circuit of the digital-to-analog converter of FIG. 6.

Referring now to FIG. 7, shown schematically therein is the switching circuit 113 for the sign/magnitude D/A converter 100. The switching circuit 113 specifically includes a D-type flip-flop 53 which accepts the pulse clock signal PCLK provided by the pulse width modulator 111 and is clocked with the count clock signal CCLK. The non-inverting Q output of the flip-flop 53 is provided as an input to a 2-input AND gate 55 which accepts the count clock signal CCLK as its other input.

The output of the AND gate 55 is provided to a 2-input OR gate 57 which accepts the pulse width modulated signal LPW1 as its other input. The output of the OR gate 57 is provided to the A input of an analog buffer 59 which further accepts the sign control signal SIGN at its B input. The reference voltages V1, V2, V3 are also provided to the buffer 59. The output provided by the buffer 59 is the level shifted pulse width modulated signal LPW2. The output of the buffer 59 is determined pursuant to the buffer inputs A and B in accordance with the following Table III:

TABLE III

| A | B | OUTPUT |
|---|---|---|
| LOW | HIGH | V2 |
| LOW | LOW | V2 |
| HIGH | HIGH | V1 |
| HIGH | LOW | V3 |

The switching circuit 113 provides the half quantum wide initial pulse of the signal LPW2 as follows. The pulse clock signal PCLK is always high during the last cycle of the count clock signal CCLK for a given pulse period T. Therefore, the Q output of the flip-flop 53 will be high for the first cycle of the count clock signal CCLK of the subsequent pulse period. During such first cycle, the count clock signal CCLK is high for the first half of the cycle, and therefore the output of the AND gate 55 will be high during the first half of such first cycle of the count clock signal CCLK. As a result, the output of the OR gate 57 will be high for at least the first half of such first cycle of the count clock signal CCLK. However, since the pulse width modulated signal LPW1 is always low during such first cycle of the count clock signal CCLK, the output of the OR gate 57 remains high only during the first half of such first cycle. Thus, during the first half of each first cycle of the count clock signal CCLK for a given pulse period, a high signal is provided to the A input of the analog buffer 59. The analog buffer 59 will therefore provide the half quantum wide pulse at the beginning of each pulse period at a level that is controlled by the sign control signal SIGN.

The width of the subsequent width modulated pulse of the signal LPW2 is controlled by the width of the signal LPW1, while the level (V1 or V3) of the width modulated pulse is controlled by the sign control signal SIGN.

The switching circuit 113 further includes another analog buffer 61 which accepts the pulse width modulated signal MPW1 at its A input and further accepts the sign control signal at its B input. The reference voltages V1, V2, V3 are also provided as inputs to the buffer 61 which provides the level shifted pulse width modulated signal MPW2 as its output. The output of the buffer 61 is determined pursuant to the buffer inputs A and B in accordance with the Table III previously set forth.

It should therefore be readily understood that the pulse width provided by the output signal MPW2 is controlled by the width of the signal MPW1, while the level (V1 or V3) of the pulse is controlled by the sign control signal SIGN.

Referring now to FIG. 3B, shown therein are certain output waveforms for the level shifted pulse width modulated signals LPW2 and MPW2 provided by the switching circuit 113 of FIG. 7 for the sign/magnitude D/A converter 100 of FIG. 6. For ease of reference, FIG. 3B includes a timing diagram of the count output of the down counter 35 (shown in the pulse width modulator 11 of FIG. 4) for one pulse period. As discussed above, the sign/magnitude D/A converter 100 provides for different outputs for the digital inputs having a zero magnitude but different signs. By way of example, V1 is a positive voltage, V2 is 0 volts, and V3 is a negative voltage equal in magnitude to the reference voltage V1.

It should be noted that the sign/magnitude A/D converter 100 has twice the resolution of the A/D converter 10, but utilizes the same clock rates.

Figure 8:
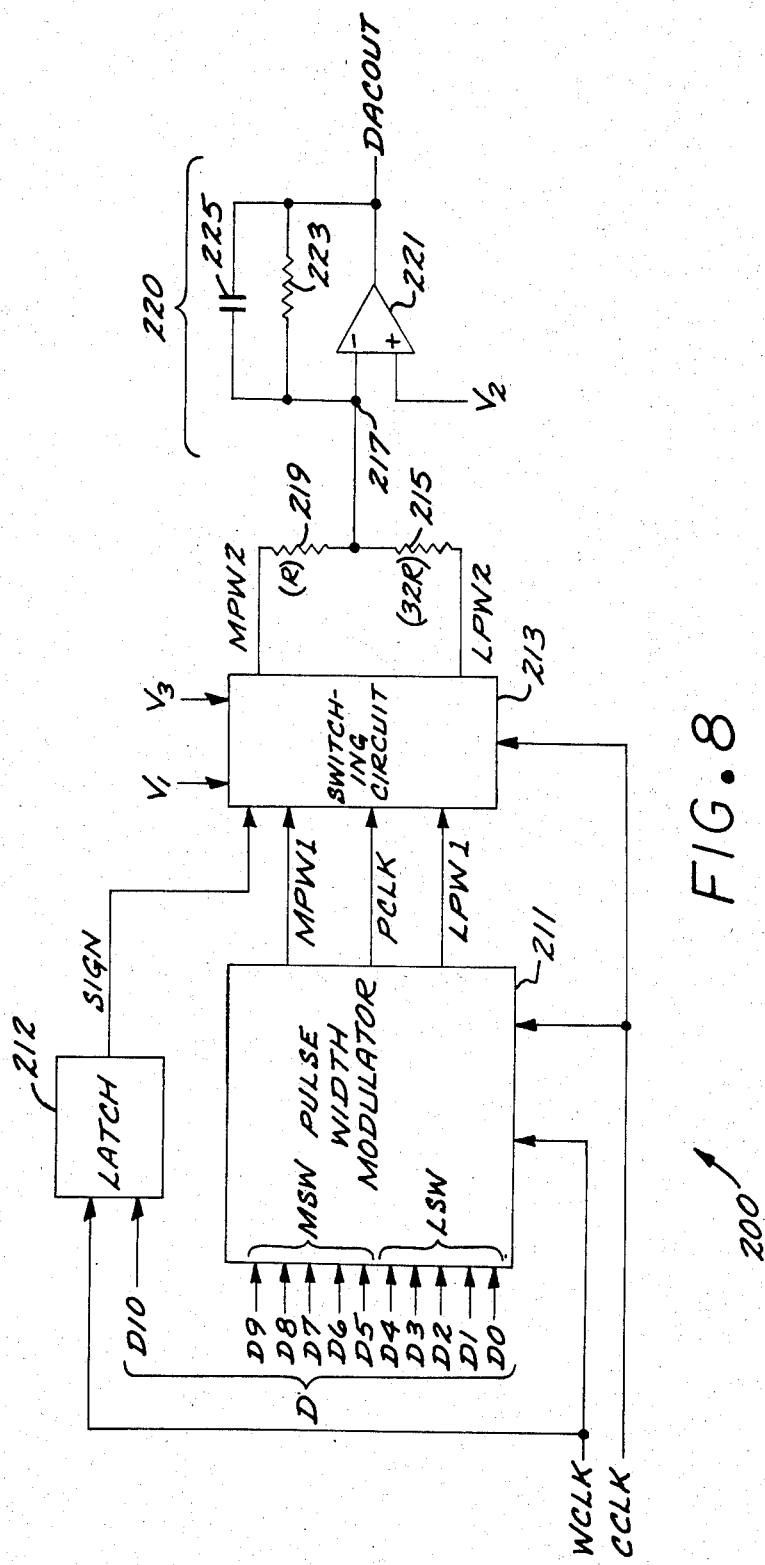
FIG. 8 is a schematic partial block diagram of a further sign/magnitude digital-to-analog converter in accordance with the invention.

Referring now to FIG. 8, shown therein is a block diagram of a sign/magnitude D/A converter 200 which is similar to the D/A converter 100 of FIG. 6, except that the level shifted pulse width modulated signals have two driven states and an open state.

With such driven and open states, the transition from a driven state to an open state takes longer than the transition from the open state to a driven state. This can be better understood with reference to the waveforms of FIG. 3C wherein V1 and V3 are the respective results of the driven states and V2 is the result of the open state. The transition from a driven state to an open state provides for a gradual pulse edge which results from the fact that when the level shifted pulse width modulated signal is switched to the open state it decays to V2 instead of being driven to V2. However, the transition from the open state to a driven state provides for a steep pulse edge.

It should therefore be readily understood that a pulse that is supposed to be N quantums wide will actually be slightly wider and includes an error. It should also be readily understood that the error is constant for positive going pulses, and is also constant for negative going pulses. However, such constant errors are different for positive and negative going pulses. As a result, errors occur in the D/A analog output in the transitions from one sign to the opposite sign. Such transition error is particularly significant for the MSW.

The foregoing problem is compensated by including in the level shifted pulse width modulated signal based on the MSW a half quantum wide fixed pulse having a level of V1 at the beginning of each pulse period. Such initial pulse forces the level shifted pulse width modulated signal to include a constant error for all of the possible values of the MSW. The constant error is manifested at the analog output as a fixed DC offset, which may be removed by an AC coupling capacitor.

The least significant word LSW and the most significant word MSW of the digital input D are provided to a pulse width modulator 211 which may be substantially similar to the pulse width modulator 11 schematically shown in FIG. 4. The pulse width modulator 211 provides pulse width modulated outputs LPW1 and MPW1 which have logical levels. The output LPW1 includes pulse widths proportional to the digital values of the LSW; and the output MPW1 includes pulse widths proportional to the digital values of the MSW.

The sign bit D10 is latched into a 1-bit latch 212 which is clocked with the word clock signal WCLK. The output of the latch 212 provides a sign control signal SIGN.

The sign control signal SIGN from the latch 212 and the pulse width modulated outputs LPW1 and MPW1 from the pulse width modulator 211 are provided as inputs to a switching circuit 213. The switching circuit 213 also receives the reference voltages V1 and V3 as inputs. The reference voltages are related as follows:

$$V3 < V1 \qquad \text{(Equation 4)}$$

In response to the pulse width modulated output LPW1, the switching circuit 213 provides a level shifted pulse width modulated output signal LPW2. For each pulse period, the signal LPW2 includes a half quantum wide pulse at the beginning of such pulse period and a subsequent width modulated pulse having a width controlled by the pulse width modulated signal LPW1. For a given pulse period, the value or level of the initial and width modulated pulses is at the reference voltage V1 if the sign control signal SIGN is low, and is at the reference voltage V3 if the sign control signal SIGN is high. In the absence of a pulse, the output signal LPW2 is in the open state. When the level shifted pulse width modulated signal LPW2 is switched to the open state, it will quickly decay to a reference voltage V2 that is half way between the reference voltages V1, V3. That is, the reference voltage V2 is related to the reference voltages V1, V3 as follows:

$$V2 = [(V3 + V1)/2] \qquad \text{(Equation 5)}$$

The foregoing conditions for the width modulated pulse of the output LPW2 are summarized in the following Table IV which sets forth the steady state level for the signal LPW2 when in the open state:

TABLE IV

| SIGN | LPW1 | LPW2 |
|------|------|------|
| LOW | HIGH | V3 |
| LOW | LOW | V2 (open) |
| HIGH | HIGH | V1 |
| HIGH | LOW | V2 (open) |

In response to the pulse width modulated output signal MPW1 from the pulse width modulator 211, the switching circuit 213 provides a level shifted pulse width modulated signal MPW2. For each pulse period, the signal MPW2 includes a positive going half quantum pulse and a subsequent width modulated pulse having a width controlled by the pulse width modulated signal MPW1 and having a voltage level controlled by the sign control signal SIGN. Particularly, for a given pulse period, the initial half quantum wide pulse will have a level of V1, and the width modulated pulse will have a voltage level of V1 or V3 depending on the sign control signal SIGN. If the sign control signal SIGN is low, the width modulated pulse is at V3 when the signal MPW1 is high, and is in the open state when the signal MPW1 is low. If the signal control signal SIGN is high, the width modulated pulse is at V1 when the signal MPW1 is high, and is in the open state when the signal MPW1 is low. When the level shifted pulse width modulated signal MPW2 is switched to the open state, it will quickly decay to the reference voltage V2 that is between the reference voltages V1, V3.

The foregoing conditions for the width modulated pulse of the output MPW2 are summarized in the following Table V which sets forth the steady state level for the signal MPW2 when in the open state:

TABLE V

| SIGN | MPW1 | MPW2 |
|------|------|------|
| LOW | HIGH | V3 |
| LOW | LOW | V2 (open) |

TABLE V-continued

| SIGN | MPW1 | MPW2 |
|---|---|---|
| HIGH | HIGH | V1 |
| HIGH | LOW | V2 (open) |

The output LPW2 of the switching circuit 213 is coupled through a weighted resistor 215 to a summing node 217. The output MPW2 of the switching circuit 213 is coupled through a weighted resistor 219 to the summing node 217. For the 5-bit LSW and MSW discussed in this example, the value of the resistor 215 is 32 times the value of the resistor 219. Thus, the resistor 215 is shown as having a value of 32R, while the resistor 219 is shown as having a value of R.

The foregoing ratio between the resistors 215, 219 follows from the fact that the weight of the MSW is $2^5$ times the weight of the LSW.

The summing node 217 is coupled to an integrator 220, which may also be considered a low pass filter and which is similar to the integrator 20 shown in FIG. 1. The integrator 220 includes an operational amplifier 221 which has its non-inverting input coupled to the summing node 217 and which provides an analog output signal DACOUT that is the analog version of the digital input D. A feedback resistor 223 and a feedback capacitor 225 are coupled in parallel between the output of the operational amplifier 221 and its inverting input. The operational amplifier 221, the feedback resistor 223 and the feedback capacitor 225 cooperate to sum the currents through the weighted resistors 215, 219 at the summing node 217. The non-inverting input of the operational amplifier 221 is coupled to the reference voltage V2 which is defined above in Equation 5 as being (V3+V1)/2.

It should be noted that although the foregoing sign/magnitude A/D converter 200 provides distinct analog outputs for digital inputs having a zero magnitude but different signs, it may be readily implemented without such distinct analog outputs whereby a plus zero magnitude and a minus zero magnitude result in the same analog output.

Figure 9:
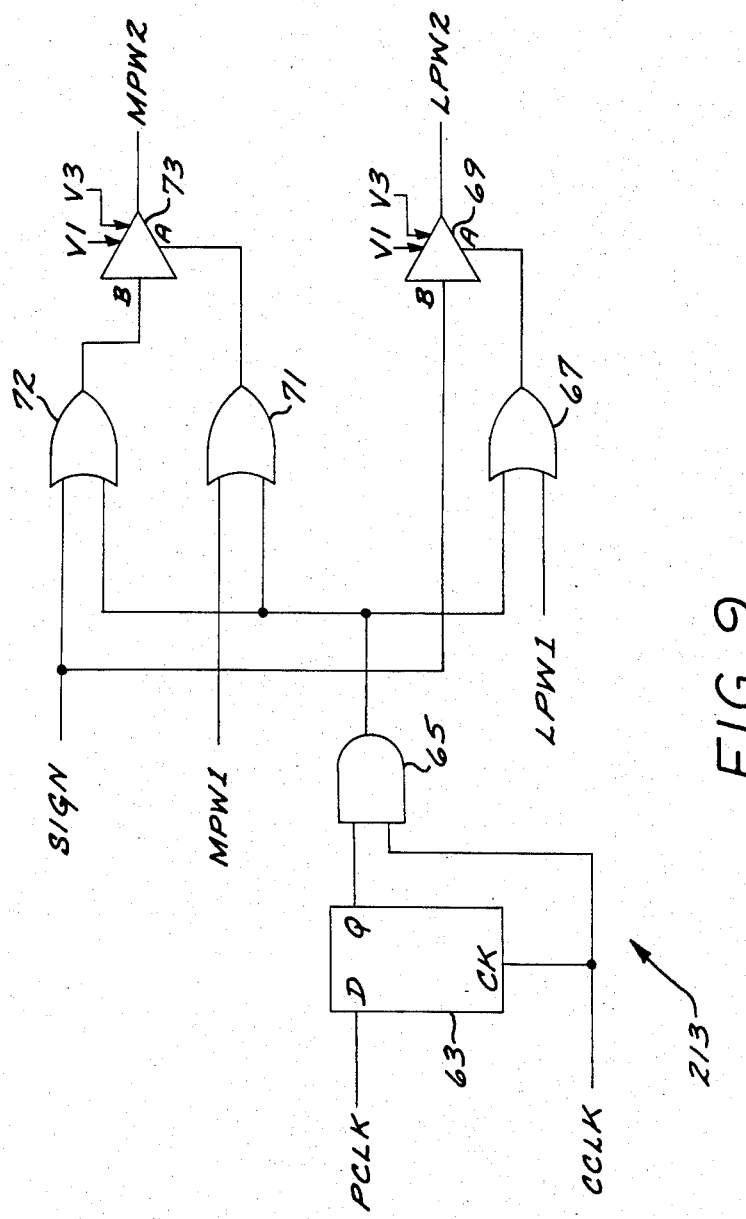
FIG. 9 is a schematic diagram of the switch circuit of the digital-to-analog converter of FIG. 8.

Referring now to FIG. 9, shown schematically therein is the switching circuit 213 for the sign/magnitude D/A converter 200. The switching circuit 213 includes circuit elements similar to the circuit elements in the switching circuit 113, and includes further elements to provide the half quantum wide initial pulse for the level shifted pulse width modulated signal MPW2. The switching circuit 213 specifically includes a D-type flip-flop 63 which accepts the pulse clock signal PCLK provided by the pulse width modulator 211 and is clocked with the count clock signal CCLK. The non-inverting Q output of the flip-flop 63 is provided as an input to a 2-input AND gate 65 which accepts the count clock signal CCLK as its other input.

The output of the AND gate 65 is provided to a 2-input OR gate 67 which accepts the pulse width modulated signal LPW1 as its other input. The output of the OR gate 67 is provided to the A input of an analog buffer 69 which further accepts the sign control signal SIGN at its B input. The reference voltages V1 and B3 are also provided to the buffer 69. The output provided by the buffer 69 is the level shifted pulse width modulated signal LPW2. The output of the buffer 69 is determined pursuant to the buffer inputs A and B in accordance with the following Table VI:

TABLE VI

| A | B | OUTPUT |
|---|---|---|
| LOW | HIGH | V2 (open) |
| LOW | LOW | V2 (open) |
| HIGH | HIGH | V1 |
| HIGH | LOW | V3 |

The switching circuit 213 further includes a 2-input OR gate 71 which receives the output of the AND gate 65 as an input. The other input to the OR gate 71 is the pulse width modulated signal MPW1 from the pulse width modulator 111 (FIG. 8). The output of the OR gate 71 is provided to an analog buffer 73 which provides the level shifted pulse width modulated signal MPW2 at its output. The B input of the analog buffer 73 receives the output of a 2-input OR gate 72. The inputs to the OR gate 72 are provided by the output of the AND gate 65 and the sign control signal SIGN. The output of the buffer 73 is determined pursuant to the buffer inputs A and B in accordance with Table VI set forth previously.

By way of example, the buffers 69, 73 may be devices having what are commonly called three-state outputs where one of such states is an open state. While the buffers 69, 73 provide for open circuit outputs, the voltage levels on their outputs decay to V2 as a result of the connection of the summing node to the operational amplifier.

The switching circuit 213 provides the initial half quantum wide pulses for the signals LPW2 and MPW2 at the beginning of each pulse period as follows. The pulse clock signal PCLK is always high during the last cycle of the count clock signal CCLK for a given pulse period. Therefore, the Q output of the flip-flop 63 will be high for the first cycle of the count clock signal CCLK of the subsequent pulse period. During such first cycle, the count clock signal CCLK is high for the first half of the cycle, and therefore the output of the AND gate 65 will be high during the first half of such first cycle of the count clock signal CCLK. As a result, the outputs of the OR gates 67, 71, 72 will be high for at least the first half of such first cycle of the count clock signal CCLK. However, since the pulse width modulated signals LPW1 and MPW1 is always low during such first cycle of the count clock signal CCLK, the output of the OR gates 67, 71 remain high only during the first half of such first cycle.

Thus, during the first half of each first cycle of the count clock signal CCLK, a high signal is provided to the A input of the buffer 69. As a result, the buffer 69 provides for the signal LPW2 a half quantum wide pulse which has a level (V1 or V3) controlled by the sign control signal SIGN.

Also during the first half of each first cycle of the count clock signal CCLK for a given pulse period, the A and B inputs of the analog buffer 73 always receive high inputs. As a result, the buffer 73 provides for the signal MPW2 the half quantum wide pulse having a level of V1 at the beginning of each pulse period.

Referring now to FIG. 3C, shown therein are certain output waveforms for the level shifted pulse width modulated signals LPW2 and MPW2 provided by the switching circuit 213 of FIG. 9 for the sign/magnitude D/A converter 200 of FIG. 8. For ease of reference, FIG. 3C includes a timing diagram of the count clock signal CCLK for 1 pulse period and the count output of the down counter 35 (shown in the pulse width modulator 11 of FIG. 4) for such pulse period. As discussed above, the sign/magnitude D/A converter 200 provides for different outputs for the +00000 and −00000 values of the least significant word LSW. By way of example, V1 is a positive voltage, V2 is 0 volts, and V3 is a negative voltage equal in magnitude to the reference voltage V1.

As mentioned previously, the pulse transitions provided at the outputs of the buffers 69, 73 are different for (a) the transition from an open state to a driven state, and (b) the transition from a driven state to an open state.

As also mentioned previously, the inclusion of an initial half quantum wide pulse having a level of V1 at the beginning of the MPW2 signal each pulse period insures that each code of the MSW will result in the same error due to the gradual pulse edge of the decay from V1 to V2. Such error will be present at the DACOUT signal provided by the operational amplifier, but may be appropriately removed, for example, by capacitive AC coupling.

Errors due to difference in pulse edges in the level shifted pulse width modulated signal LPW2 are not as important since its contribution to the DACOUT signal is much smaller than the contribution of the MPW2 signal.

It should be noted that although the foregoing described sign/magnitude A/D converter 200 includes the extra codes for the digital inputs having an all 0's magnitude but different signs, it may be readily implemented without such extra codes.

The foregoing described sign/magnitude A/D converters 100, 200 are more complex than the magnitude only A/D converter 10. However, such additional complexity provides significant advantages. The addition of a sign bit doubles resolution without increasing any of the clock rates. Further, in applications such as audio where the most sensitivity to noise and cross-talk occurs in the region of the middle of the output range of the D/A converter, a sign/magnitude D/A converter provides substantial reduction in sensitivity. Particularly, with a magnitude only D/A converter the sensitivity at the middle of the D/A converter output range is 6 db less than the sensitivity at full scale. In contrast, with a sign/magnitude D/A converter having an output range centered at zero, the sensitivity at zero magnitude may be reduced about 50 db or more below sensitivity at full scale.

The reduced sensitivity of sign/magnitude D/A converters is particularly significant in LSI implementations where several independent D/A converters may be incorporated on a single integrated circuit chip.

Although the foregoing described D/A converter systems process the input digital signal in two parallel groups, it should be readily appreciated that more parallel groups could be utilized, which would allow for a greater reduction in the count clock frequency. For example, for an N-bit magnitude digital input, the use of three groups would allow for a count clock rate of $2^{N/3}$ times the pulse or conversion frequency. In such an application, N should be integrally divisible by 3 and each group would include N/3 bits.

The foregoing has been a description of pulse width modulated digital-to-analog converter systems which allow for a high number of input bits without requiring extremely high clock rates. Stated another way, the disclosed pulse width modulated digital-to-analog converter systems allow for high digital input rates without requiring extremely high clock rates. Such advantages are achieved by processing the digital input signal in parallel groups where each group includes only predetermined bits of the input word.

Still other advantages of the D/A converter system of the invention include the use of primarily digital logic and few precision components (i.e., the summing resistors) which allow it to be readily implemented with LSI technologies.

Although the foregoing has been a description and illustration of specific embodiments of the invention, various modifications and changes thereto can be made by persons skilled in the art without departing from the scope and spirit of the invention as defined by the following claims.

What is claimed is:

1. A digital-to-analog converter for converting a digital input signal having parallel words, each word including a sign bit and N magnitude bits which include multi-bit groups of weighted significance, and which is provided at an input word rate of W Hz, comprising:
    pulse generating means responsive to the sign bit and to a first and a second multi-bit group of the N magnitude bits for providing (a) a first pulse modulated signal having pulse widths and levels as a function of the sign bit and the value of the first multi-bit group and (b) a second pulse modulated signal having pulse widths and levels as a function of the sign bit and the value of the second multi-bit group, said first pulse modulated signal including a first predetermined pulse for a first value of the sign bit or a second predetermined pulse for a second value of the sign bit;
    means for weighting said first and second pulse modulated signals as a function of the relative weighted significance of the first and second multi-bit groups; and
    means for summing and filtering said weighted signals to provide an analog output signal which as a result of said first and second predetermined pulses includes distinct outputs for (a) an input word having said first sign bit value and magnitude bits that are all 0's and (b) an input word having said second sign bit and magnitude bits that are all 0's.

2. The digital-to-analog converter of claim 1 wherein said pulse generating means comprises:
    modulation means responsive to the first and second multi-bit groups for providing (a) a first intermediate pulse width modulated signal having widths determined by the first multi-bit group and (b) a second intermediate pulse width modulated signal having widths determined by the second multi-bit group; and
    switching means responsive to the sign bit and said first and second intermediate pulse width modulated signals for providing (a) said first pulse modulated signal as a function of the sign bit and said first intermediate pulse width modulated signal and (b) said second pulse modulated signal as a function of the sign bit and said second intermediate pulse width modulated signal.

3. The digital-to-analog converter of claim 2 wherein said modulation means comprises:
    counting means responsive to a clock signal for providing an output count;
    logic means responsive to said counting means for providing a pulse clock signal having a frequency of P Hz and defining pulse intervals;

first comparison means responsive to the first multi-bit group of the N magnitude bits, said output count, and said pulse clock signal for providing said first intermediate pulse width modulated signal which includes a modulated pulse width during each pulse interval; and second comparison means responsive to the second multi-bit group of the N magnitude bits, said output count, and said pulse clock signal for providing said second intermediate pulse width modulated signal which includes a modulated pulse width during each pulse interval.

4. The digital-to-analog converter of claim 3 wherein each of the first and second multi-bit groups includes M bits and said clock signal for said counting means has a clock frequency of $P \times 2^M$ Hz.

5. The digital-to-analog converter of claim 3 wherein said switching means comprises:

first level shifting means responsive to the sign bit and said first intermediate pulse width modulated signal for providing said first pulse modulated signal which includes during each pulse interval said first or second predetermined pulse and a modulated pulse having a width controlled by said first intermediate signal and a level that is a function of the sign bit; and second level shifting means responsive to the sign bit and said second intermediate pulse width modulated signal for providing said second pulse modulated signal which includes during each pulse interval a modulated pulse having a width controlled by said second intermediate signal and a level that is a function of the sign bit.

6. The digital-to-analog converter of claim 4 wherein N is two times M.

7. A digital-to-analog converter for converting a digital input signal having parallel words, each word including a sign bit and N magnitude bits which include multi-bit groups of weighted significance, and which is provided at an input word rate of W Hz, comprising:

pulse generating means responsive to the sign bit and to a first and a second multi-bit group of the N magnitude bits for providing (a) a first pulse modulated signal having pulse widths and levels as a function of the sign bit and the value of the first multi-bit group and (b) a second pulse modulated signal having pulse widths and levels as a function of the sign bit and the value of the second multi-bit group, said pulse generating means further compensating different transition times of said second pulse modulated signal from one level to another;

means for weighting said first and second pulse modulated signals as a function of the relative weighted significance of the first and second multi-bit groups; and means for summing and filtering said weighted signals to provide an analog output signal.

8. The digital-to-analog converter of claim 7 wherein said second pulse modulated signal includes a predetermined fixed pulse.

9. The digital-to-analog converter of claim 8 wherein said pulse generating means comprises:

modulation means responsive to the first and second multi-bit groups for providing (a) a first intermediate pulse width modulated signal having widths determined by the first multi-bit group and (b) a second intermediate pulse width modulated signal having widths determined by the second multi-bit group; and switching means responsive to the sign bit and said first and second intermediate pulse width modulated signals for providing (a) said first pulse modulated signal as a function of the sign bit and said first intermediate pulse width modulated signal and (b) said second pulse modulated signal as a function of the sign bit and said second intermediate pulse width modulated signal.

10. The digital-to-analog converter of claim 9 wherein said modulation means comprises:

counting means responsive to a clock signal for providing an output count;

logic means responsive to said counting means for providing a pulse clock signal having a frequency of P Hz and defining pulse intervals;

first comparison means responsive to the first multi-bit group of the N magnitude bits, said output count, and said pulse clock signal for providing said first intermediate pulse width modulated signal which includes a modulated pulse width during each pulse interval; and second comparison means responsive to the second multi-bit group of the N magnitude bits, said output count, and said pulse clock signal for providing said second intermediate pulse width modulated signal which includes a modulated pulse width during each pulse interval.

11. The digital-to-analog converter of claim 10 wherein each of the first and second multi-bit groups includes M bits and said clock signal for said counting means has a clock frequency of $P \times 2^M$ Hz.

12. The digital-to-analog converter of claim 10 wherein said switching means comprises:

first level shifting means responsive to the sign bit and said first intermediate pulse width modulated signal for providing said first pulse modulated signal which includes during each pulse interval a modulated pulse having a width controlled by said first intermediate signal and a level that is a function of the sign bit; and second level shifting means responsive to the sign bit and said second intermediate pulse width modulated signal for providing said second pulse modulated signal which includes during each pulse interval said predetermined fixed pulse and a modulated pulse having a width controlled by said second intermediate signal and a level that is a function of the sign bit.

13. The digital-to-analog converter of claim 11 wherein N is two times M.

* * * * *